United States Patent
Jeon et al.

(10) Patent No.: US 9,570,597 B2
(45) Date of Patent: Feb. 14, 2017

(54) HIGH ELECTRON MOBILITY TRANSISTOR

(71) Applicant: Samsung Electronics Co., Ltd., Suwon-Si, Gyeonggi-Do (KR)

(72) Inventors: Woo-chul Jeon, Daegu (KR); Jong-seob Kim, Hwaseong-si (KR); Ki-yeol Park, Suwon-si (KR); Young-hwan Park, Seoul (KR); Jai-kwang Shin, Anyang-si (KR); Jae-joon Oh, Seongnam-si (KR); Jong-bong Ha, Yongin-si (KR); Sun-kyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/732,746

(22) Filed: Jan. 2, 2013

(65) Prior Publication Data

US 2014/0042449 A1    Feb. 13, 2014

(30) Foreign Application Priority Data

Aug. 7, 2012 (KR) ........................ 10-2012-0086396

(51) Int. Cl.
| | |
|---|---|
| *H01L 29/78* | (2006.01) |
| *H01L 29/10* | (2006.01) |
| *H01L 29/20* | (2006.01) |
| *H01L 29/778* | (2006.01) |
| *H01L 29/423* | (2006.01) |

(52) U.S. Cl.
CPC ....... *H01L 29/778* (2013.01); *H01L 29/42376* (2013.01); *H01L 29/7786* (2013.01); *H01L 29/1066* (2013.01); *H01L 29/2003* (2013.01); *H01L 29/4236* (2013.01)

(58) Field of Classification Search
CPC ............. H01L 29/778; H01L 29/42376; H01L 29/7786; H01L 29/4236; H01L 29/1066; H01L 29/2003
USPC .......... 257/194–195, E29.246–E29.253, 192, 257/E21.403, 407; 438/167, 172
See application file for complete search history.

(56) References Cited

U.S. PATENT DOCUMENTS

| | | | |
|---|---|---|---|
| 6,351,000 B1 * | 2/2002 | Oikawa ............ | H01L 31/03046 257/192 |
| 7,038,252 B2 * | 5/2006 | Saito et al. ................... | 257/192 |
| 7,982,243 B1 * | 7/2011 | Iversen et al. ................ | 257/202 |
| 2005/0189559 A1 * | 9/2005 | Saito et al. ................... | 257/189 |
| 2006/0273347 A1 * | 12/2006 | Hikita et al. .................. | 257/192 |

(Continued)

FOREIGN PATENT DOCUMENTS

| | | |
|---|---|---|
| JP | 2008243927 A | 10/2008 |
| JP | 2008306083 A | 12/2008 |

(Continued)

*Primary Examiner* — John C Ingham
*Assistant Examiner* — Didarul Mazumder
(74) *Attorney, Agent, or Firm* — Harness, Dickey & Pierce, P.L.C.

(57) ABSTRACT

According to example embodiments, a high electron mobility transistor (HEMT) includes a channel supply layer that induces a two-dimensional electron gas (2DEG) in a channel layer, a source electrode and a drain electrode that are at sides of the channel supply layer, a depletion-forming layer that is on the channel supply layer and contacts the source electrode, a gate insulating layer on the depletion-forming layer, and a gate electrode on the gate insulating layer. The depletion-forming layer forms a depletion region in the 2DEG.

13 Claims, 5 Drawing Sheets

(56) References Cited

U.S. PATENT DOCUMENTS

| | | | |
|---|---|---|---|
| 2009/0032820 A1* | 2/2009 | Chen ............................ | 257/76 |
| 2010/0155720 A1* | 6/2010 | Kaneko ............... | H01L 29/2003 |
| | | | 257/43 |
| 2011/0062438 A1* | 3/2011 | Kaneko ......................... | 257/43 |
| 2011/0068371 A1* | 3/2011 | Oka ............................. | 257/194 |
| 2013/0256684 A1* | 10/2013 | Nishimori et al. ............ | 257/76 |

FOREIGN PATENT DOCUMENTS

| | | |
|---|---|---|
| KR | 20110066370 A | 6/2011 |
| KR | 20110105032 A | 9/2011 |

* cited by examiner

HIGH ELECTRON MOBILITY TRANSISTOR

CROSS-REFERENCE TO RELATED APPLICATIONS

This application claims priority under 35 U.S.C. §119 to Korean Patent Application No. 10-2012-0086396, filed on Aug. 7, 2012, in the Korean Intellectual Property Office, the disclosure of which is incorporated herein in its entirety by reference.

BACKGROUND

1. Field

Example embodiments relate to semiconductor devices, and more particularly, to high electron mobility transistors (HEMTs).

2. Description of the Related Art

Various power conversion systems include devices for controlling the flow of current and switching current on or off, that is, power devices. The efficiency of power conversion systems may depend on the efficiency of power devices.

As power devices, power metal-oxide-semiconductor field-effect transistors (MOSFETs) using silicon (Si) or power insulated gate bipolar transistors (IGBTs) using Si have been mainly used. However, it is difficult to improve the efficiency of power devices using Si due to limitations in physical properties of Si and manufacturing processes. Attempts to improve conversion efficiency by applying group III-V compound semiconductors to power devices have been made. In particular, high electron mobility transistors (HEMTs) using a heterojunction between compound semiconductors have attracted attention.

A HEMT includes semiconductor layers having different electrical polarization characteristics. In the HEMT, a first semiconductor layer having a relatively high polarizability may induce a two-dimensional electron gas (2DEG) in a second semiconductor layer attached to the first semiconductor layer, and the 2DEG may have a very high electron mobility.

When a HEMT is normally on, current flows between a drain electrode and a source electrode due to a low resistance when a gate voltage is 0 V, current and power may be consumed, and a negative voltage has to be applied to a gate electrode in order to cut off the current between the drain electrode and the source electrode. A HEMT may be normally off so that a current between a drain electrode and a source electrode is cut off when a gate voltage is 0 V. A HEMT that may be normally off by adding a depletion-forming layer has recently been studied.

SUMMARY

Example embodiments relate to high electron mobility transistors (HEMTs).

Additional aspects will be set forth in part in the description which follows and, in part, will be apparent from the description, or may be learned by practice of example embodiments.

According to example embodiments, a high electron mobility transistor (HEMT) includes: a channel layer that includes a first semiconductor material; a channel supply layer that includes a second semiconductor material, the channel supply layer being configured to induce a two-dimensional electron gas (2DEG) in the channel layer; a source electrode and a drain electrode that are at sides of the channel supply layer; a depletion-forming layer that is on the channel supply layer, the depletion-forming layer contacting the source electrode, and the depletion-forming layer being configured to form a depletion region in the 2DEG; a gate insulating layer that is on the depletion-forming layer; and a gate electrode that is on the gate insulating layer.

The gate insulating layer may define an opening that exposes at least a portion of the depletion-forming layer. The opening of the gate insulating layer may expose a top surface of the depletion-forming layer, and the source electrode may contact the exposed top surface of the depletion-forming layer.

The depletion-forming layer may have a strip shape, and include both side surfaces that are inclined. The gate electrode may include first and second gate electrodes. The first and second gate electrode may be on the gate insulating layer. The first and second gate electrode may be on the both side surfaces of the depletion-forming layer. The first and second gate electrodes may be on the both side surfaces of the depletion-forming layer in a longitudinal direction of the depletion-forming layer.

A passivation layer may cover the first and second gate electrodes and the gate insulating layer. The passivation layer may define a via-hole that exposes a top surface of the depletion-forming layer. The source electrode may contact the top surface of the depletion-forming layer through the via-hole defined by the passivation layer.

A top surface of the channel supply layer may include recesses on both sides of the depletion-forming layer, and the gate insulating layer may extend to the recesses from the both sides of the depletion-forming layer.

The gate insulating layer may define an opening that exposes an end portion of the depletion-forming layer, and the source electrode may contact the end portion of the depletion-forming layer through the opening in the gate insulating layer. A passivation layer may cover the gate electrode, the gate insulating layer, and the depletion-forming layer. The passivation layer may define a via-hole that exposes the end portion of the depletion-forming layer. The source electrode may be connected to the end portion of the depletion-forming layer through the via-hole defined by the passivation layer.

The first semiconductor material may be a GaN-based material. The second semiconductor material may be at least one nitride that includes at least one of aluminum (Al), gallium (Ga), indium (In), and boron (B).

The depletion-forming layer may include a p-type semiconductor material. The depletion-forming layer may include a group III-V nitride semiconductor material.

According to example embodiments, a HEMT may reduce gate leakage current by increasing current paths when being turned on. The HEMT may include a freewheeling diode therein. That is, when the HEMT is driven by a reverse voltage when being turned off, current may flow to a drain electrode through a depletion-forming layer that is connected to a source electrode.

BRIEF DESCRIPTION OF THE DRAWINGS

These and/or other aspects and advantage of example embodiments will become apparent and more readily appreciated from the following description of non-limiting embodiments, as illustrated in the accompanying drawings in which like reference characters refer to the same parts throughout the different views. The drawings are not necessarily to the scale, emphasis instead being placed upon illustrating principles of example embodiments. In the drawings:

FIG. 3 is a cross-sectional view illustrating a state where the HEMT of FIGS. 1 and 2 is turned on;

FIG. 5 is a cross-sectional view illustrating a state where the HEMT of FIG. 4 is turned on;

DETAILED DESCRIPTION

Figure 1:
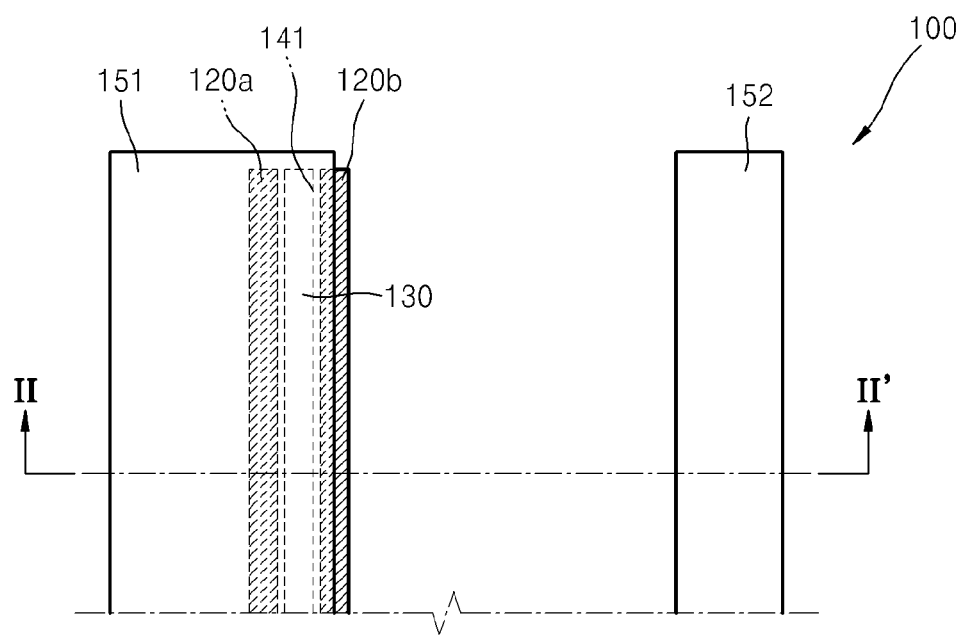
FIG. 1 is a plan view illustrating a high electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
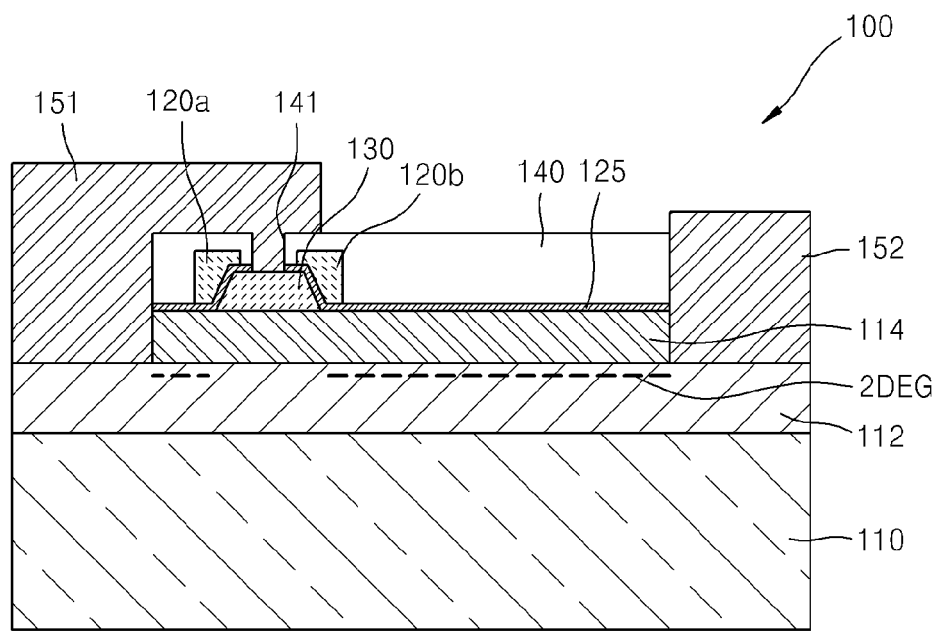
FIG. 2 is a cross-sectional view taken along line II-II' of FIG. 1.

FIG. 1 is a plan view illustrating a high electron mobility transistor (HEMT) 100 according to example embodiments. FIG. 2 is a cross-sectional view taken along line II-II' of FIG. 1.

Referring to FIGS. 1 and 2, a channel layer 112 is disposed on a substrate 110. The substrate 110 may include, for example; sapphire, silicon (Si), SiC, or GaN. However, example embodiments are not limited thereto, and the substrate 110 may include other materials. The channel layer 112 may include a first semiconductor material. The first semiconductor material may be, but is not limited to, a group III-V compound semiconductor material. For example, the channel layer 112 may be a GaN-based material layer. As a specific example, the channel layer 112 may be a GaN layer. In this case, the channel layer 112 may be an undoped GaN layer, or a GaN layer doped with desired (and/or alternatively predetermined) impurities if necessary.

Although not shown in FIGS. 1 and 2, a desired (and/or alternatively predetermined) buffer layer may be further disposed between the substrate 110 and the channel layer 112. The buffer layer limits (and/or prevents) crystallinity of the channel layer 112 from being reduced by reducing a difference between the substrate 110 and the channel layer 112 in terms of a lattice constant and a thermal expansion coefficient. The buffer layer may include at least one nitride that includes at least one of aluminium (Al), gallium (Ga), indium (In), and boron (B), and may have a single- or a multi-layer structure. The buffer layer may include at least one of AlN, GaN, AlGaN, InGaN, AlInN, and AlGaInN. A desired (and/or alternatively predetermined) seed layer for growing a buffer layer may be further disposed between the substrate 110 and the buffer layer.

A channel supply layer 114 may be disposed on the channel layer 112. The channel supply layer 114 may induce a two-dimensional electron gas (2DEG) in the channel layer 112. The 2DEG may be formed in the channel layer 112 under an interface between the channel layer 112 and the channel supply layer 114. The channel supply layer 114 may include a second semiconductor material that is different from the first semiconductor material that is used to form the channel layer 112. The second semiconductor material may be different from the first semiconductor material in terms of at least one of polarization characteristics, an energy bandgap, and a lattice constant. For example, at least one of a polarizability and an energy bandgap of the second semiconductor material may be greater than that of the first semiconductor material.

The channel supply layer 114 may include at least one nitride that includes at least one of Al, Ga, In, and B, and may have a single- or multi-layer structure. As a specific example, the channel supply layer 114 may include, but is not limited to, at least one of AlGaN, AlInN, InGaN, AlN, and AlInGaN. The channel supply layer 114 may be an undoped layer, or may be a layer doped with desired (and/or alternatively predetermined) impurities. A thickness of the channel supply layer 114 may be equal to or less than tens of nm. For example, a thickness of the channel supply layer 114 may be equal to or less than, but is not limited to, about 50 nm.

A source electrode 151 and a drain electrode 152 may be disposed on the channel layer 112 at both sides of the channel supply layer 114. The source electrode 151 and the drain electrode 152 may be electrically connected to the 2DEG. The source electrode 151 and the drain electrode 152 may be disposed on the channel supply layer 114, and may be inserted into the channel supply layer 114 or into the channel layer 112. The source electrode 151 and the drain electrode 152 may be formed in various other ways. The source electrode 151 may be formed to contact a depletion-forming layer 130 as will be described below.

The depletion-forming layer 130 may be disposed on the channel supply layer 114. The depletion-forming layer 130 may form a depletion region in the 2DEG. Due to the depletion-forming layer 130, an energy bandgap of a portion of the channel supply layer 114 under the depletion-forming layer 130 may be increased, and thus a depletion region of the 2DEG may be formed in a portion of the channel layer 112 corresponding to the depletion-forming layer 130. Accordingly, a portion of the 2DEG corresponding to the depletion-forming layer 130 may be cut or may have characteristics (for example, an electron density) different from those of other portions. The cut portion of the 2DEG may be referred to as a 'cut region'. Due to the cut region, the HEMT 100 may be normally off.

The depletion-forming layer 130 may include a p-type semiconductor material. That is, the depletion-forming layer 130 may be a p-type semiconductor layer or a semiconductor layer doped with p-type impurities. Also, the depletion-forming layer 130 may include a group III-V nitride semiconductor. For example, the depletion-forming layer 130 may include at least one of GaN, AlGaN, InN, AlInN, InGaN, and AlInGaN, and may be doped with p-type impurities such as magnesium (Mg). As a specific example, the depletion-forming layer 130 may be a p-GaN layer or a p-AlGaN layer. Due to the depletion-forming layer 130, an energy bandgap of a portion of the channel supply layer 114 under the depletion-forming layer 130 may be increased, and a cut region of the 2DEG may be formed. The depletion-forming layer 130 may be formed on the channel supply layer 114 to have, for example, a strip shape. Both sides of the depletion-forming layer 130 may be inclined. However, example embodiments are not limited thereto, and the depletion-forming layer 130 may be formed in various other shapes.

A gate insulating layer 125 is formed on the depletion-forming layer 130. The gate insulating layer 125 may be formed on the channel supply layer 114 to extend. The gate insulating layer 125 may include at least one of, for example, $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and a combination thereof. As long as an insulating material is used for a general transistor, the insulating material may be used as a material for the gate insulating layer 125. The gate insulating layer 125 may be formed to expose at least a portion of a surface of the depletion-forming layer 130. For example, the gate insulating layer 125 may be formed to open a top surface of the depletion-forming layer 130. For example, the gate insulating layer 125 may define an opening that exposes at least a portion of the depletion-forming layer 130.

A gate electrode is formed on the gate insulating layer 125. In detail, the gate electrode includes first and second gate electrodes 120a and 120b that are formed on the gate insulating layer 125 at both sides of the exposed top surface of the depletion-forming layer 130. The first and second gate electrodes 120a and 120b may be formed, for example, on both side surfaces of the depletion-forming layer 130 in a longitudinal direction of the depletion-forming layer 130. Each of the first and second gate electrodes 120a and 120b may include any of various metal materials or metal compounds. The first and second gate electrodes 120a and 120b may be disposed closer to the source electrode 151 than the drain electrode 152 in FIGS. 1 and 2. However, example embodiments are not limited thereto and positions of the first and second gate electrodes 120a and 120b may be changed. The first and second gate electrodes 120a and 120b may constitute a common electrode by being electrically connected to each other.

A passivation layer 140 may be further formed between the source electrode 151 and the drain electrode 152 to cover the first and second gate electrodes 120a and 120b and the gate insulating layer 125. The passivation layer 140 protects the first and second gate electrodes 120a and 120b and insulates the first and second gate electrodes 120a and 120b from electrically contacting the source electrode 151. The passivation layer 140 may include a Si oxide, a Si nitride, or any of various other insulating materials. A via-hole 141 for connecting the source electrode 151 and the opened top surface of the depletion-forming layer 130 is formed in and/or defined by the passivation layer 140. When a source electrode material is filled in the via-hole 141, the source electrode 151 may contact the opened top surface of the depletion-forming layer 130.

Figure 3:
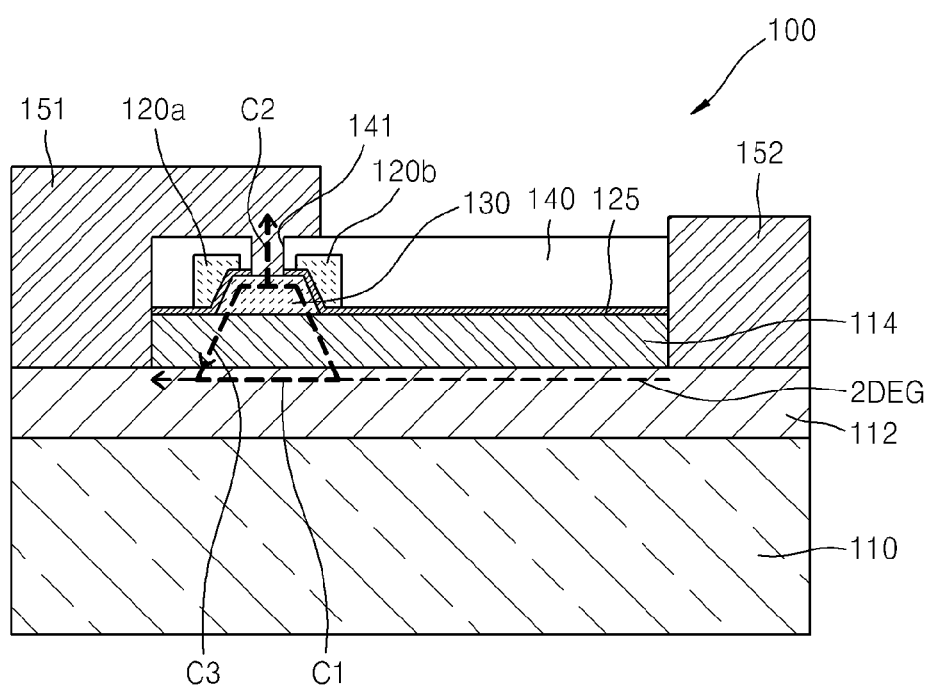

FIG. 3 is a cross-sectional view illustrating a state where the HEMT 100 of FIGS. 1 and 2 is turned on. Referring to FIG. 3, when a voltage equal to or greater than a threshold voltage is applied to the first and second gate electrodes 120a and 120b, the HEMT 100 is turned on. In this case, three current paths, that is, first through third current paths C1, C2, and C3, through which current flows from the drain electrode 152 to the source electrode 151 may be formed. In detail, when a channel formed under the first and second gate electrodes 120a and 120b is turned on, the first current path C1 through which current flows through the 2DEG formed in the channel layer 112 may be formed. Since an n channel is formed due to inversion on a side wall of the depletion-forming layer 130 under the second gate electrode 120b, the second current path C2 through which current flows in the order of the channel layer 112, the channel supply layer 114, the depletion-forming layer 130, and the source electrode 151 may be formed. Also, since an n channel is formed due to inversion on both side walls of the depletion-forming layer 130 under the first and second gate electrodes 120a and 120b, the third current path C3 through which current flows in the order of the channel layer 112, the channel supply layer 114, the depletion-forming layer 130, the channel supply layer 114, and the channel layer 112 may be formed.

As described above, the HEMT 100 may reduce gate leakage current and turn-on resistance by forming the first through third current paths C1, C2, and C3 when being turned on. The HEMT 100 may include a freewheeling diode therein. In detail, when the HEMT 100 is driven by a reverse voltage when being turned off, current may flow to the drain electrode 152 through the depletion-forming layer 130 that is connected to the source electrode 151. Accordingly, the depletion-forming layer 130 and the channel supply layer 114 may constitute a freewheeling diode.

Figure 4:
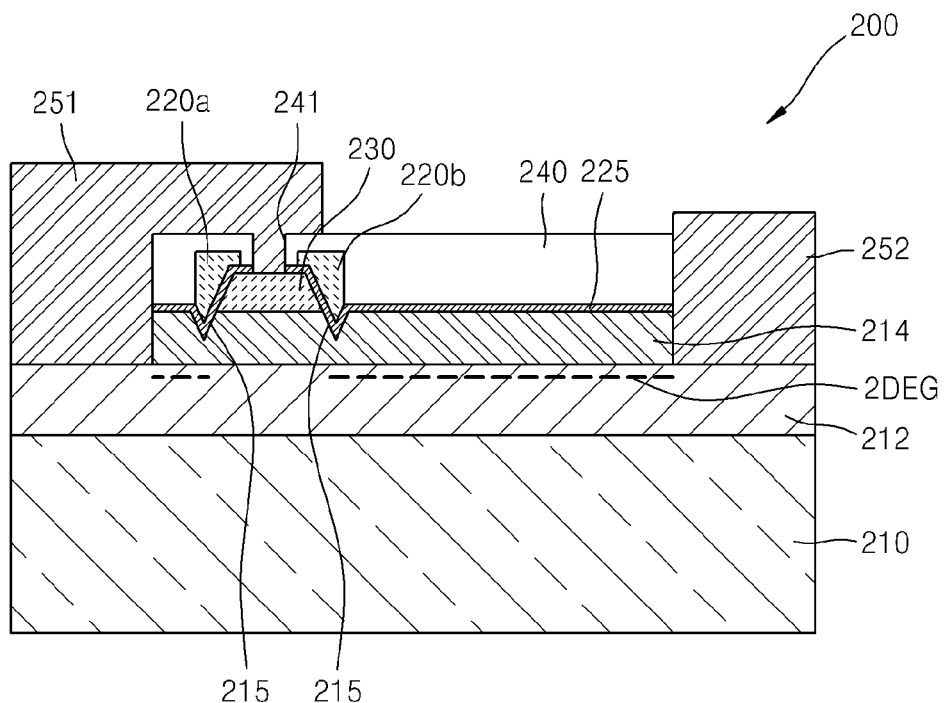
FIG. 4 is a cross-sectional view illustrating a HEMT according to example embodiments.

FIG. 4 is a cross-sectional view illustrating a HEMT 200 according to example embodiments. The following explanation will focus on a difference between the HEMT 100 of FIGS. 1 and 2 and the HEMT 200 of FIG. 4.

Referring to FIG. 4, a channel layer 212 is disposed on a substrate 210. The channel layer 212 may include a first semiconductor material. The first semiconductor material may be, but is not limited to, a group III-V compound semiconductor material. For example, the channel layer 212 may be a GaN-based material layer. Although not shown in FIG. 4, a desired (and/or alternatively predetermined) buffer layer may be further disposed between the substrate 210 and the channel layer 212, and a desired (and/or alternatively predetermined) seed layer for growing a buffer layer may be further disposed between the substrate 210 and the buffer layer.

A channel supply layer 214 may be disposed on the channel layer 212. The channel supply layer 214 may induce a 2DEG in the channel layer 212. The channel supply layer 214 may include a second semiconductor material different from the first semiconductor material that is used to form the channel layer 212. The channel supply layer 214 may include at least one nitride that includes at least one of, for example, Al, Ga, In, and B, and may have a single- or multi-layer structure. As a specific example, the channel supply layer 214 may include, but is not limited to, at least one of AlGaN, AlInN, InGaN, AlN, and AlInGaN. The channel supply layer 214 may be an undoped layer, or a layer doped with desired (and/or alternatively predetermined) impurities.

A source electrode 251 and a drain electrode 252 may be disposed on the channel layer 212 at both sides of the channel supply layer 214. The source electrode 251 and the drain electrode 252 may be disposed on the channel supply layer 214, and may be inserted into the channel supply layer 214 or into the channel layer 212. The source electrode 251 and the drain electrode 252 may be formed in various other ways. The source electrode 251 may be formed to contact a depletion-forming layer 230 as will be described below.

The depletion-forming layer 230 may be disposed on the channel supply layer 214. The depletion-forming layer 230 may form a depletion region in the 2DEG. The depletion-forming layer 230 may include a p-type semiconductor material. That is, the depletion-forming layer 230 may be a p-type semiconductor layer or a semiconductor layer doped with p-type impurities. Also, the depletion-forming layer 230 may include a group III-V nitride semiconductor. For example, the depletion-forming layer 230 may include at least one of GaN, AlGaN, InN, AlInN, InGaN, and AlInGaN, and may be doped with p-type impurities such as Mg. As a specific example, the depletion-forming layer 230 may be a p-GaN layer or a p-AlGaN layer. Both sides of the depletion-forming layer 230 may be inclined. However, example embodiments are not limited thereto, and the depletion-forming layer 230 may be formed in various other ways.

Recesses 215 may be formed to a desired (and/or alternatively predetermined) depth in a top surface of the channel supply layer 214 on both sides of the depletion-forming layer 230. The recesses 215 may be formed in the top surface of the channel supply layer 214 in a longitudinal direction of the depletion-forming layer 230. A gate insulating layer 225 is formed on the depletion-forming layer 230. The gate insulating layer 225 may extend to the recesses 215 formed in the channel supply layer 214. The gate insulating layer 225 may be formed to expose at least a portion of a surface of the depletion-forming layer 230. For example, the gate insulating layer 225 may be formed to open a top surface of the depletion-forming layer 230. A gate electrode is formed on the gate insulating layer 225. In detail, the gate electrode includes first and second gate electrodes 220a and 220b formed on the gate insulating layer 225 disposed at both sides of the exposed top surface of the depletion-forming layer 230 and in the recesses 215. The first and second gate electrodes 220a and 220b may be formed, for example, on the gate insulating layer 225 in a longitudinal direction of the depletion-forming layer 230. The first and second gate electrodes 220a and 220b may constitute a common electrode by being electrically connected to each other.

A passivation layer 240 may be further formed between the source electrode 251 and the drain electrode 252 to cover the first and second gate electrodes 220a and 220b and the gate insulating layer 225. A via-hole 241 for connecting the source electrode 251 and the opened top surface of the depletion-forming layer 230 is formed in the passivation layer 240. Due to the via-hole 241, the source electrode 251 may contact the opened top surface of the depletion-forming layer 230.

Figure 5:
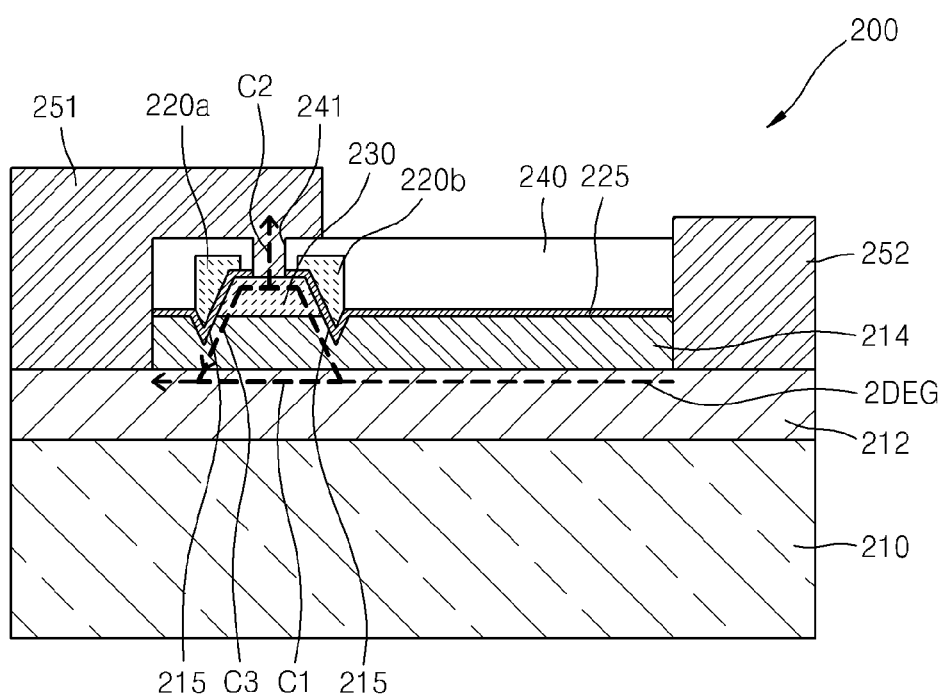

FIG. 5 is a cross-sectional view illustrating the HEMT 200 of FIG. 4 being turned on. Referring to FIG. 5, when a voltage that is equal to or greater than a threshold voltage is applied to the first and second gate electrodes 220a and 220b, the HEMT 200 is turned on. In this case, three current paths, that is, first through third current paths C1, C2, and C3, through which current flows from the drain electrode 252 to the source electrode 251 may be formed. In detail, when a channel formed under the first and second gate electrodes 220a and 220b is turned on, the first current path C1 through which current flows through the 2DEG formed in the channel layer 212 may be formed. Since an n channel is formed due to inversion on a side wall of the depletion-forming layer 230 and a side wall of the channel supply layer 212 contacting one of the recesses 215, the second current path C2 through which current flows in the order of the channel layer 212, the channel supply layer 214, the depletion-forming layer 230, and the source electrode 251 may be formed. Since an n channel is formed on a side wall of the channel supply layer 214, current may more easily flow through the second current path C2. Since an n channel is formed due to inversion on both side walls of the depletion-forming layer 230 and both side walls of the channel supply layer 214 contacting the recesses 215 under the first and second gate electrodes 220a and 220b, the third current path C3 through which current flows in the order of the channel layer 212, the channel supply layer 214, the depletion-forming layer 230, the channel supply layer 214, and the channel layer 212 may be formed. Since an n channel is formed on both side walls of the channel supply layer 214, current may more easily flow through the third current path C3. Accordingly, the HEMT 200 of FIG. 4 may reduce gate leakage current and turn-on resistance more effectively than the HEMT 100 of FIGS. 1 and 2. Also, as described above, the HEMT 200 of FIG. 4 may include a freewheeling diode therein.

Figure 6:
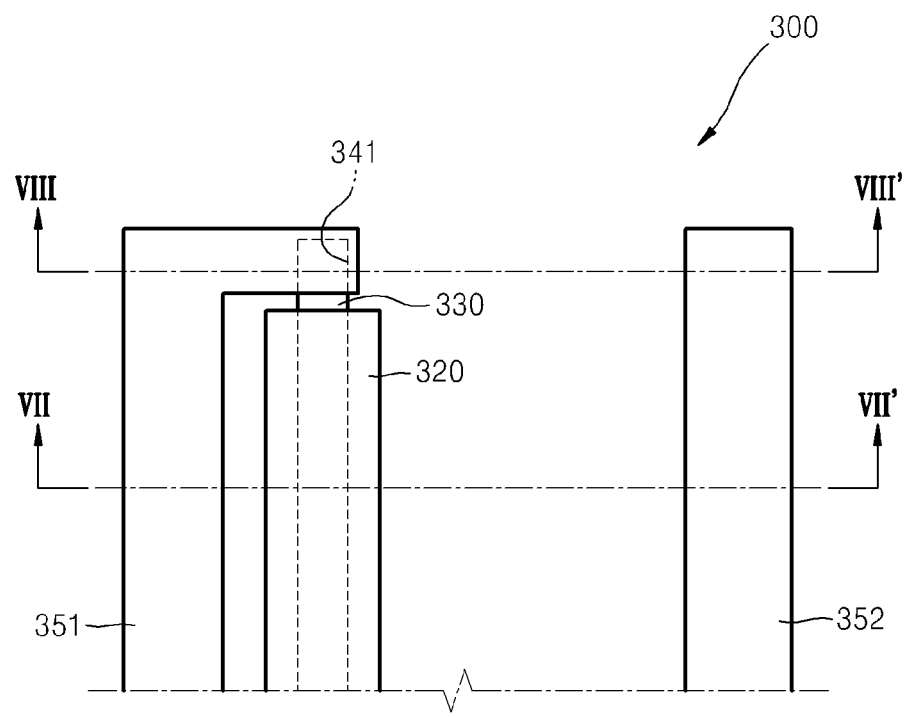
FIG. 6 is a plan view illustrating a HEMT according to example embodiments.
Figure 7:
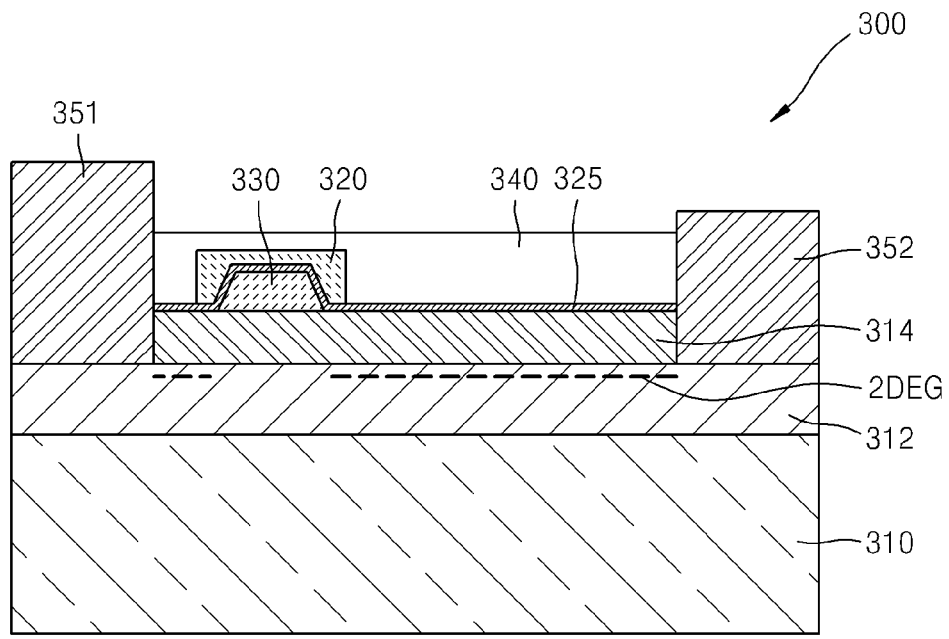
FIG. 7 is a cross-sectional view taken along line VII-VII' of FIG. 6.
Figure 8:
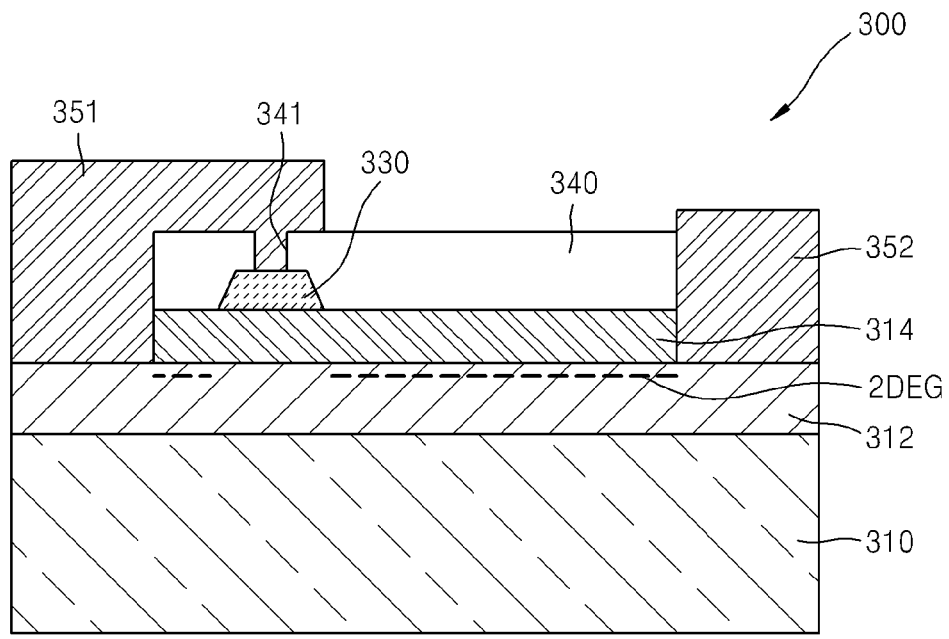
FIG. 8 is a cross-sectional view taken along line VIII-VIII' of FIG. 6.

FIG. 6 is a plan view illustrating a HEMT 300 according to example embodiments. FIG. 7 is a cross-sectional view taken along line VII-VII' of FIG. 6. FIG. 8 is a cross-sectional view taken along line VIII-VIII' of FIG. 6. The following explanation will focus on a difference between the HEMTs 100 and 200 and the HEMT 300.

Referring to FIGS. 6 through 8, a channel layer 312 is disposed on a substrate 310. The substrate 310 may include, for example, but is not limited to, sapphire, Si, SiC, or GaN. The channel layer 312 may include a first semiconductor material. The first semiconductor material may be, but is not limited to, a group III-V compound semiconductor material. For example, the channel layer 310 may be a GaN-based material layer. As a specific example, the channel layer 310 may be a GaN layer. Although not shown in FIGS. 6 through 8, a desired (and/or alternatively predetermined) buffer layer may be further disposed between the substrate 310 and the channel layer 312, and a desired (and/or alternatively predetermined) seed layer for growing a buffer layer may be further disposed between the substrate 310 and the buffer layer.

A channel supply layer 314 may be disposed on the channel layer 312. The channel supply layer 314 may induce a 2DEG in the channel layer 312. The channel supply layer 314 may include a second semiconductor material different from the first semiconductor material. The channel supply layer 314 may include at least one selected from nitrides including at least one of Al, Ga, In, and B, and may have a single- or multi-layer structure. As a specific example, the channel supply layer 314 may include, but is not limited to, at least one of AlGaN, AlInN, InGaN, AlN, and AlInGaN. The channel supply layer 314 may be an undoped layer, or a layer doped with desired (and/or alternatively predetermined) impurities.

A source electrode 351 and a drain electrode 352 may be disposed on the channel layer 312 at both sides of the channel supply layer 314. The source electrode 351 and the drain electrode 352 may be electrically connected to the 2DEG. The source electrode 351 and the drain electrode 352 may be disposed on the channel supply layer 314, and may be inserted into the channel supply layer 314 or the channel layer 312. The source electrode 351 and the drain electrode 352 may be formed in various other ways. The source electrode 351 may be formed to contact a depletion-forming layer 330 as will be described below.

The depletion-forming layer 330 may be disposed on the channel supply layer 314. The depletion-forming layer 330 may form a depletion region in the 2DEG. The depletion-forming layer 330 may include a p-type semiconductor material. That is, the depletion-forming layer 330 may be a p-type semiconductor layer or a semiconductor layer doped with p-type impurities. Also, the depletion-forming layer 330 may include a group III-V nitride semiconductor. For example, the depletion-forming layer 330 may include at least one of GaN, AlGaN, InN, AlInN, InGaN, and AlInGaN, and may be doped with p-type impurities such as Mg. As a specific example, the depletion-forming layer 330 may be a p-GaN layer or a p-AlGaN layer. Due to the depletion-forming layer 330, an energy bandgap of a portion of the channel supply layer 314 under the depletion-forming layer 330 may be increased, and thus a cut region of the 2DEG may be formed. The depletion-forming layer 330 may be formed on the channel supply layer 314 to have, for example, a strip shape. Both sides of the depletion-forming layer 330 may be inclined. However, example embodiments are not limited thereto, and the depletion-forming layer 330 may be formed in various other ways.

A gate insulating layer 325 is formed on the depletion-forming layer 330. The gate insulating layer 325 may be formed on the channel supply layer 314 to extend. The gate insulating layer 325 may be formed to open at least a portion of a surface of the depletion-forming layer 330. The gate insulating layer 325 may be formed to open an end portion of the depletion-forming layer 330. A gate electrode 320 is formed on the gate insulating layer 325. In detail, the gate electrode 320 may be formed, for example, on the depletion-forming layer 330 in a longitudinal direction of the depletion-forming layer 330. The gate electrode 320 may include any of various metal materials or metal compounds.

A passivation layer may be further formed between the source electrode 351 and the drain electrode 352 to cover the gate electrode 320 and the gate insulating layer 325. The passivation layer 340 protects the opened end portion of the depletion-forming layer 330 and the gate electrode 320. A via-hole 341 for connecting the source electrode 351 and the opened end portion of the depletion-forming layer 330 is formed in the passivation layer 340. When a source electrode material is filled in the via-hole 341, the source electrode 351 may contact the opened end portion of the depletion-forming layer 330.

According to the HEMT 300 of FIGS. 6 through 8, when the HEMT 300 is turned on, three current paths through which current flows from the drain electrode 352 to the source electrode 351 may be formed, like in the HEMTs 100 and 200. In detail, when a channel formed under the gate electrode 320 is turned on, a first current path through which current flows through the 2DEG formed in the channel layer 312 may be formed. Since an n channel is formed due to inversion on a side wall of the depletion-forming layer 330 under one side of the gate electrode 320, a second current path through which current flows in the order of the channel layer 312, the channel supply layer 314, the depletion-forming layer 330, and the source electrode 351 may be formed. Also, since an n channel is formed due to inversion on both side walls of the depletion-forming layer 330 under the gate electrode 320, a third current path through which current flows in the order of the channel layer 312, the channel supply layer 314, the depletion-forming layer 330, the channel supply layer 314, and the channel layer 312 may be formed.

As described above, a HEMT according to example embodiments may reduce gate leakage current and turn-on resistance by adding current paths when being turned on. Also, the HEMT may include a freewheeling diode therein. That is, when the HEMT is driven by a reverse voltage when being turned off, current may flow to a drain electrode through a depletion-forming layer that is connected to a source electrode. Accordingly, the depletion-forming layer and a channel supply layer may constitute a freewheeling diode.

While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
   a channel layer that includes a first semiconductor material;
   a channel supply layer that includes a second semiconductor material, the channel supply layer being configured to induce a two-dimensional electron gas (2DEG) in the channel layer;
   a source electrode and a drain electrode that are at sides of the channel supply layer;
   a depletion-forming layer that is disposed to protrude on the top surface of the channel supply layer, the depletion-forming layer being configured to form a depletion region in the 2DEG;
   a gate insulating layer on the top surface of the depletion-forming layer; and
   a gate electrode on the top surface of the gate insulating layer,
   wherein the gate insulating layer defines an opening that exposes at least a portion of a top surface of the depletion-forming layer,
   wherein the exposed top surface of the depletion-forming layer through the opening of the gate insulating layer directly contacts the source electrode,
   wherein the gate electrode is insulated from the source electrode and the depletion-forming layer.

2. The HEMT of claim 1, wherein the depletion-forming layer has a strip shape, and both side surfaces of the depletion-forming layer are inclined.

3. The HEMT of claim 1, wherein the gate electrode includes first and second gate electrodes, the first and second gate electrodes are on the gate insulating layer, and
   the first and second gate electrodes are on the both side surfaces of the depletion-forming layer.

4. The HEMT of claim 3, wherein the first and second gate electrodes are on the both side surfaces of the depletion-forming layer in a longitudinal direction of the depletion-forming layer.

5. The HEMT of claim 3, further comprising:
   a passivation layer covering the first and second gate electrodes and the gate insulating layer, wherein
   the passivation layer defines a via-hole that exposes the top surface of the depletion-forming layer, and
   the source electrode contacts the top surface of the depletion-forming layer through the via-hole defined by the passivation layer.

6. The HEMT of claim 3, wherein a top surface of the channel supply layer includes recesses on both sides of the depletion-forming layer, and the gate insulating layer extends to the recesses from the both sides of the depletion-forming layer.

7. The HEMT of claim 1, wherein the opening defined by the gate insulating layer exposes an end portion of the depletion-forming layer, and the source electrode contacts the end portion of the depletion-forming layer through the opening in the gate insulating layer.

8. The HEMT of claim 7, further comprising:
   a passivation layer covering the gate electrode, the gate insulating layer, and the depletion-forming layer,
   wherein the passivation layer defines a via-hole that exposes the end portion of the depletion-forming layer, and the source electrode is connected to the end portion of the depletion-forming layer through the via-hole defined by the passivation layer.

9. The HEMT of claim 1, wherein the first semiconductor material is a GaN-based material.

10. The HEMT of claim 1, wherein the second semiconductor material includes at least one nitride that includes at least one of aluminum (Al), gallium (Ga), indium (In), and boron (B).

11. The HEMT of claim 1, wherein the depletion-forming layer includes a p-type semiconductor material.

12. The HEMT of claim 11, wherein the depletion-forming layer includes a group III-V nitride semiconductor material.

13. The HEMT of claim 1, wherein a width of the depletion region in the 2DEG corresponds to a width of the depletion-forming layer.

* * * * *